(12) United States Patent
Qin et al.

(10) Patent No.: US 9,588,382 B2
(45) Date of Patent: Mar. 7, 2017

(54) PIXEL STRUCTURE, MANUFACTURING METHOD OF PIXEL STRUCTURE, ARRAY SUBSTRATE, DISPLAY PANEL, AND DISPLAY DEVICE

(71) Applicants: Shanghai AVIC Optoelectronics Co., Ltd., Shanghai (CN); Tianma Micro-Electronics Co., Ltd., Shenzhen (CN)

(72) Inventors: Dandan Qin, Shanghai (CN); Zhaokeng Cao, Shanghai (CN); Yao Lin, Shanghai (CN); Yinghua Mo, Shanghai (CN)

(73) Assignees: SHANGHAI AVIC OPTOELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/711,339

(22) Filed: May 13, 2015

(65) Prior Publication Data
US 2016/0103372 A1    Apr. 14, 2016

(30) Foreign Application Priority Data
Oct. 10, 2014    (CN) .......................... 2014 1 0531283

(51) Int. Cl.
*H01L 29/04*    (2006.01)
*H01L 31/036*    (2006.01)
(Continued)

(52) U.S. Cl.
CPC .... *G02F 1/134309* (2013.01); *G02F 1/13624* (2013.01); *G02F 1/136286* (2013.01);
(Continued)

(58) Field of Classification Search
CPC ............ G02F 1/134309; G02F 1/1368; G02F 1/136286; G02F 1/13624; G02F 1/13439;
(Continued)

(56) References Cited

U.S. PATENT DOCUMENTS 8,044,905 B2 * 10/2011  Kasahara ............ H01L 27/1214
                                                        257/202
9,323,122 B2 *  4/2016  Jiang ...................... H01L 27/124
(Continued)

FOREIGN PATENT DOCUMENTS

CN        1612023 A    5/2005
CN      101329460 A   12/2008
(Continued)

*Primary Examiner* — Shouxiang Hu
(74) *Attorney, Agent, or Firm* — Faegre Baker Daniels LLP

(57) ABSTRACT

The present disclosure provides a pixel structure, a manufacturing method of a pixel structure, an array substrate, a display panel, and a display device. The pixel structure includes a plurality of data lines, a plurality of scan lines, a plurality of pixel units and a pixel electrode in each pixel unit including a plurality of slits. An end of the slit includes at least one corner. The white pixel unit includes a first TFT and a second TFT. In a row of pixel units, a first TFT of each white pixel unit is electrically connected to a pixel electrode of the white pixel unit, and a second TFT of each white pixel unit is electrically connected to a pixel electrode of a pixel unit adjacent to the white pixel unit. The corner of the slit in the pixel electrode electrically connected with the second TFT extends toward the second TFT.

10 Claims, 9 Drawing Sheets

(51) Int. Cl.
*G02F 1/136* (2006.01)
*G02F 1/1343* (2006.01)
*G02F 1/1362* (2006.01)
*H01L 27/32* (2006.01)
*H01L 27/12* (2006.01)
*H01L 27/146* (2006.01)

(52) U.S. Cl.
CPC ...... *H01L 27/124* (2013.01); *H01L 27/14603* (2013.01); *H01L 27/326* (2013.01); *H01L 27/3213* (2013.01); *H01L 27/3218* (2013.01); *G02F 2201/40* (2013.01)

(58) Field of Classification Search
CPC ........ G02F 2001/136295; G02F 2001/134345; G02F 2201/52; H01L 27/124; H01L 27/326; H01L 27/14603; H01L 27/3213; H01L 27/3218; H01L 37/3262
USPC .......................... 257/72, 59; 349/144, 43, 48
See application file for complete search history.

(56) References Cited

U.S. PATENT DOCUMENTS

| | | | |
|---|---|---|---|
| 9,361,841 B2 * | 6/2016 | Liao | G09G 3/3696 |
| 2005/0094078 A1 * | 5/2005 | Kang | G02F 1/134363 |
| | | | 349/141 |
| 2009/0179842 A1 | 7/2009 | Chen et al. | |
| 2015/0187301 A1 * | 7/2015 | Yoon | G09G 3/36 |
| | | | 345/88 |

FOREIGN PATENT DOCUMENTS

| | | |
|---|---|---|
| CN | 102109691 A | 6/2011 |
| CN | 102854680 A | 1/2013 |
| JP | 2012212079 | 11/2012 |
| JP | 2014041366 A | 3/2014 |
| KR | 20120042433 A | 5/2012 |

* cited by examiner

PIXEL STRUCTURE, MANUFACTURING METHOD OF PIXEL STRUCTURE, ARRAY SUBSTRATE, DISPLAY PANEL, AND DISPLAY DEVICE

CROSS-REFERENCE TO RELATED APPLICATION

This application claims priority to Chinese Application No. 201410531283.2, filed Oct. 10, 2014, which is herein incorporated by reference in its entirety.

TECHNICAL FIELD

The present disclosure relates to a field of display technologies, in particular, to a pixel structure, a manufacturing method of the pixel structure, an array substrate, a display panel, and a display device.

BACKGROUND

With the development of display technologies, Liquid Crystal Display (LCD) devices have been widely used, and the display effect of the LCD devices is improved continuously.

A pixel structure located on a Thin Film Transistor (TFT) array substrate is an important part of the LCD device, with different pixel structures forcing the LCD device to generate different display effects. FIG. 1 is a schematic structure diagram of the pixel structure in the related art. As shown in FIG. 1, the pixel structure of the LCD device includes a plurality of data lines 11, a plurality of scan lines 12, a plurality of pixel units 13 formed by intersecting the plurality of data lines 11 with the plurality of scan lines 12, and a TFT 14 and a pixel electrode 15 located in each of the pixel units 13, where the TFT 14 is electrically connected to the pixel electrode 15 located in a pixel unit including the TFT 14. A red pixel unit, a green pixel unit, a blue pixel unit, and a white pixel unit are indicated by characters R, G, B, and W in Figures, respectively.

The pixel structure in FIG. 1 includes the red pixel unit, the green pixel unit, the blue pixel unit, and the white pixel unit. As such, light transmittance of the whole LCD device can be improved. However, because of the white pixel units provided, the numbers of the red pixel units, green pixel units and blue pixel units are reduced under a given sized pixel structure. Therefore, when a single color image is displayed, the brightness of the single color image will be decreased significantly.

SUMMARY

The present disclosure provides a pixel structure, a manufacturing method of a pixel structure, an array substrate, a display panel, and a display device to solve a technical problem in the related art that brightness of a single color image will be decreased significantly in the pixel structure formed by a red pixel unit, a green pixel unit, a blue pixel unit, and a white pixel unit, when displaying the single color image.

Embodiments of the disclosure provide a pixel structure, including:
a plurality of data lines and a plurality of scan lines; and
a plurality of pixel units formed by intersecting the plurality of data lines with the plurality of scan lines, wherein each of the pixel units corresponds to one of the plurality of data lines and one of the plurality of scan lines, and the plurality of pixel units comprises first-color pixel units, second-color pixel units, third-color pixel units and white pixel units arranged in sequence;
each of the pixel units comprise a pixel electrode comprising a plurality of slits, with an end of at least one of the slits comprising at least one corner;
the white pixel unit comprises a first thin film transistor and a second thin film transistor, wherein in a row of pixel units, a first thin film transistor of each white pixel unit is electrically connected to a pixel electrode of the white pixel unit, and a second thin film transistor of each white pixel unit is electrically connected to a pixel electrode of a pixel unit adjacent to the white pixel unit;
wherein, the corner of the slit in the pixel electrode electrically connected with the second thin film transistor extends toward the second thin film transistor.

Embodiments of the disclosure provide a manufacturing method of a pixel structure, including:
forming a first thin film transistor and a second thin film transistor;
forming a plurality of data lines and a plurality of scan lines, wherein a plurality of pixel units are formed by intersecting the plurality of data lines with the plurality of scan lines, and each of the pixel units corresponds to one of the plurality of data lines and one of the plurality of scan lines, and the plurality of pixel units comprises first-color pixel units, second-color pixel units, third-color pixel units, and white pixel units arranged in sequence, and the white pixel unit comprises the first thin film transistor and the second thin film transistor; and
forming a pixel electrode in each of the pixel units, wherein the pixel electrode includes a plurality of slits, and an end of at least one of the slits comprises at least one corner, and in a row of pixel units, a first thin film transistor of each white pixel unit is electrically connected to a pixel electrode of the white pixel unit, and a second thin film transistor of each white pixel unit is electrically connected to a pixel electrode of a pixel unit adjacent to the white pixel unit, and wherein, the corner of the slit in the pixel electrode electrically connected with the second thin film transistor extends toward the second thin film transistor.

Embodiments of the disclosure provide an array substrate, including the above pixel structure.

Embodiments of the disclosure provide a display panel, including the above array substrate.

Embodiments of the disclosure provide a display device, including the above display panel.

With the pixel structure, the manufacturing method of the pixel structure, the array substrate, display panel, and the display device according to the embodiments of the present disclosure, since in a row of pixel units, the second TFT of the pixel unit adjacent to the white pixel unit is disposed within the white pixel unit, the pixel unit controlled by the second TFT has more space to dispose the pixel electrode so as to allow a bigger-sized pixel electrode, so that the opening of the pixel unit including the pixel electrode is bigger, and thus the brightness of the color image corresponding to the pixel unit is effectively improved when displaying the color image.

While multiple embodiments are disclosed, still other embodiments of the disclosure will become apparent to those skilled in the art from the following detailed description, which shows and describes illustrative embodiments of the disclosure. Accordingly, the drawings and detailed description are to be regarded as illustrative in nature and not restrictive.

BRIEF DESCRIPTION OF THE DRAWINGS

Other features, objects and advantages of the disclosure will become apparent from the following detailed description made to nonrestrictive embodiments with reference to the accompanying drawings below, in which.

Figure 1:
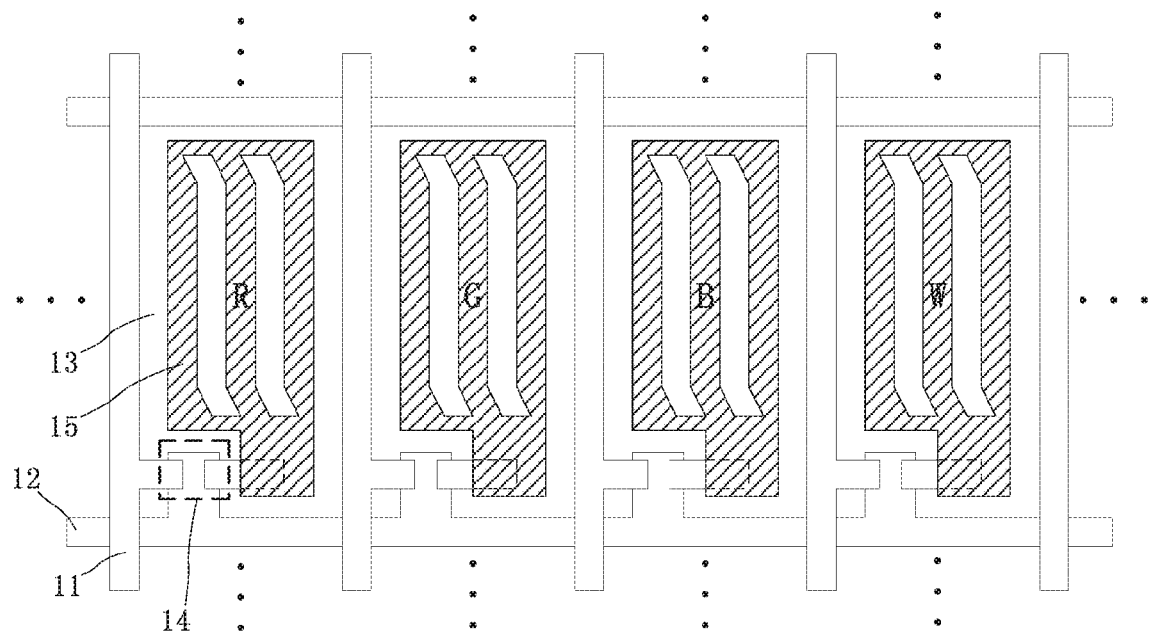
FIG. 1 is a schematic diagram of the structure of a pixel structure in the related art.

While the disclosure is amenable to various modifications and alternative forms, specific embodiments have been shown by way of example in the drawings and are described in detail below. The intention, however, is not to limit the disclosure to the particular embodiments described. On the contrary, the disclosure is intended to cover all modifications, equivalents, and alternatives falling within the scope of the disclosure as defined by the appended claims.

DETAILED DESCRIPTION

The present disclosure will be further illustrated in detail below in conjunction with the accompanying drawings and embodiments. It may be understood that specific embodiments described herein are merely for explaining the disclosure rather than limiting the disclosure. Additionally, it is noted that merely partial contents associated with the disclosure rather than all contents are illustrated in the accompanying drawings for ease of description.

Figure 2A:
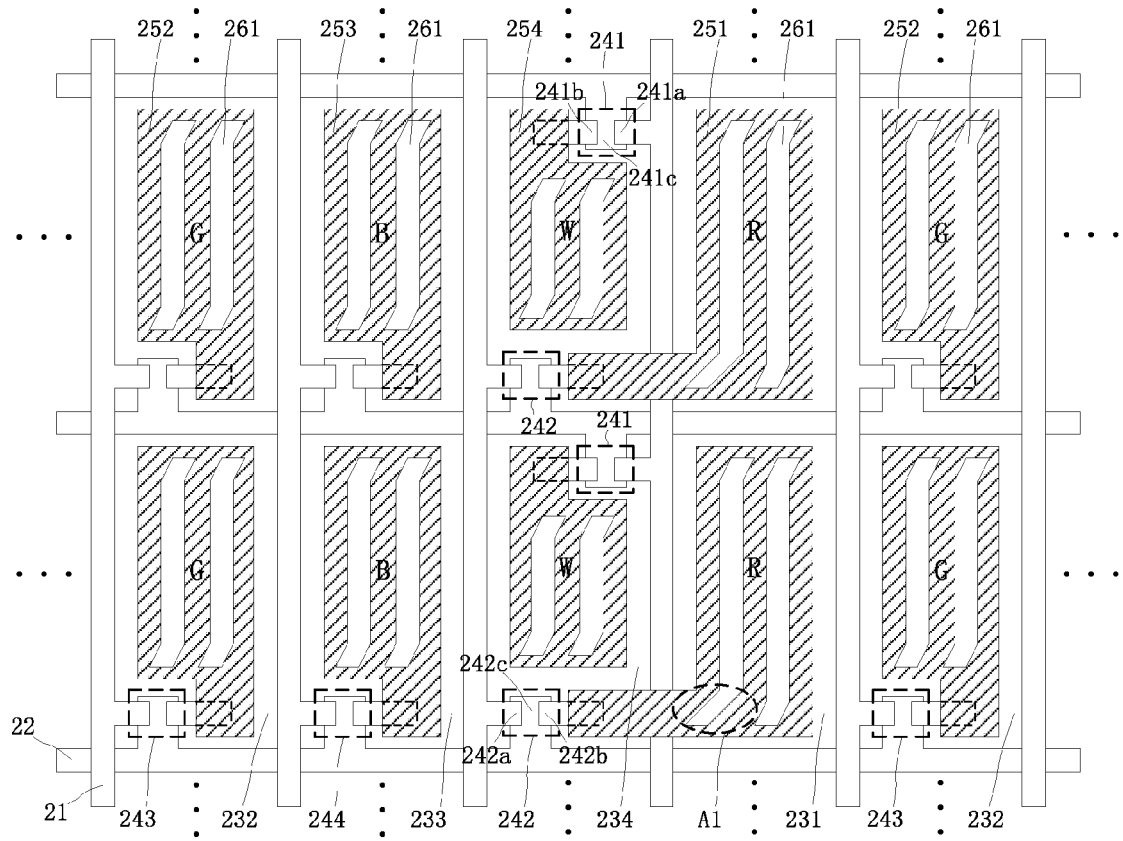
FIG. 2A is a schematic diagram of the structure of a pixel structure according to embodiments of the disclosure.

Embodiments of the disclosure provide a pixel structure. FIG. 2A is a schematic diagram of the structure of a pixel structure according to embodiments of the disclosure. As shown in FIG. 2A, the pixel structure includes a plurality of data lines 21, a plurality of scan lines 22, and a plurality of pixel units 23 formed by intersecting the plurality of data lines 21 with the plurality of scan lines 22, where each of the pixel units 23 corresponds to one of the plurality of data lines 21 and one of the plurality of scan lines 21. The plurality of pixel units include first-color pixel units (red pixel units 231 shown in FIG. 2A), second-color pixel units (green pixel units 232 shown in FIG. 2A), third-color pixel units (blue pixel units 233 shown in FIG. 2A), and white pixel units 234 arranged in sequence. Each of the pixel unit includes a pixel electrode (such as a pixel electrode 251 included in the red pixel unit 231, a pixel electrode 252 included in the green pixel unit 232, a pixel electrode 253 included in the blue pixel unit 233, and a pixel electrode 254 included in the white pixel unit 234). The pixel electrode includes a plurality of slits, an end of at least one of the slits includes at least one corner A1. The white pixel unit 234 includes a first TFT 241 and a second TFT 242. In a row of pixel unit, a first TFT 241 of each white pixel unit is electrically connected to a pixel electrode of the white pixel unit, and the second TFT 242 is electrically connected to a pixel electrode of a pixel unit adjacent to the white pixel unit (a pixel electrode 251 of the red pixel unit 231 in the same row with the white pixel unit 234 and adjacent to a right side of the white pixel unit 234 in FIG. 2A). The corner of the slit in the pixel electrode electrically connected with the second thin film transistor extends toward the second thin film transistor.

It should be noted that the display of the pixel unit is implemented by the pixel electrode of the pixel unit and the thin film transistor electrically connected with and configured for controlling the pixel electrode. The thin film transistor controls the pixel electrode, and hence controls the pixel unit including the pixel electrode. The scan line electrically connected with the gate electrode of the thin film transistor can turn on or turn off the thin film transistor. The data line electrically connected with the source electrode of the thin film transistor can provide a data signal for the pixel electrode electrically connected with the thin film transistor when the thin film transistor is turned on. Based on this, each of the above pixel units 23 corresponds to one of the data lines 21 and one of the scan lines 22. Specifically, the data line 21 corresponding to the pixel unit 23 is the one electrically connected with the thin film transistor 24 for controlling the pixel unit 23; and the scan line 22 corresponding to the pixel unit 23 is the one electrically connected with the thin film transistor 24 for controlling the pixel unit 23.

In FIG. 2A, illustratively, the first-color pixel unit is set as a red pixel unit 231, the second-color pixel unit is set as a green pixel unit 232, and the third-color pixel unit is set as a blue pixel unit 233. In other examples, the first-color pixel unit may be set as a green pixel unit, the second-color pixel unit may be set as a red pixel unit, and the third-color pixel unit may be set as a blue pixel unit; or alternatively, the first-color pixel unit may be set as a blue pixel unit, the second-color pixel unit may be set as a red pixel unit, and the third-color pixel unit may be set as a green pixel unit; or alternatively, the first-color pixel unit, the second-color pixel unit, and the third-color pixel unit may be respectively set as a combination of a red pixel unit, a green pixel unit, and a blue pixel unit, which is not limited thereto. For ease of description, the first-color pixel unit is set as a red pixel unit 231, the second-color pixel unit is set as a green pixel unit 232, and the third-color pixel unit is set as a blue pixel unit 233, for example.

As described above, since in a row of pixel units, the second TFT 242 of the pixel unit (may be the red pixel unit, the green pixel unit, or the blue pixel unit, for example) adjacent to the white pixel unit 234 is disposed within the white pixel unit 234, the pixel unit controlled by the second TFT 242 has more space to dispose the pixel electrode so as to allow a bigger-sized pixel electrode as compared with the structure in the related art that the second TFT is disposed in the pixel unit controlled by itself, so that the opening of the pixel unit including the pixel electrode is bigger, and thus the brightness of the color image corresponding to the pixel unit is effectively improved when displaying the color image. Additionally, the corner of the slit in the pixel unit electrically connected with the second TFT extends towards the second TFT so that the affection on the light transmittance which is caused by the end of the corner may be reduced.

Referring to FIG. 2A, in a row of pixel units, a second TFT 242 of each white pixel unit 234 is electrically connected with a pixel electrode 251 of a red pixel unit 231 adjacent to the white pixel unit 234. Therefore, when displaying a red image, the pixel unit shown in FIG. 2 can effectively improve the brightness of the red image.

As shown in FIG. 2A, a source electrode 241a of the first TFT 241 is electrically connected to the data line 21 (i.e., the data line 21 on the left of the white pixel unit 234 in FIG. 2A) corresponding to the white pixel unit 234 including the first TFT 241; a gate electrode 241c of the first TFT 241 is electrically connected to the scan line 22 (i.e., the scan line 22 above the white pixel unit 234 in FIG. 2A) corresponding to the white pixel unit 234 including the first TFT 241, and a drain electrode 241b of the first TFT 241 is electrically connected to the pixel electrode 254 of the white pixel unit 234 including the first TFT 241; further, a source electrode 242a of the second TFT 242 is electrically connected to the data line 21 (i.e., the data line 21 on the left of the white pixel unit 234 in FIG. 2A) corresponding to the red pixel unit 231 in the same row with and adjacent to the white pixel unit 234 including the second TFT 242; a gate electrode 242c of the second TFT 242 is electrically connected to the scan line 22 (i.e., the scan line 22 below the white pixel unit 234 in FIG. 2A) corresponding to the red pixel unit 231 in the same row with and adjacent to the white pixel unit 234 including the second TFT 242, and a drain electrode 242b of the second TFT 242 is electrically connected to the pixel electrode 251 of the red pixel unit 231 in the same row with and adjacent to the white pixel unit 234 including the second TFT 242. Additionally, a drain electrode of the TFT 243 of the green pixel unit 232 is electrically connected with the pixel electrode 252 of the green pixel unit 232, a gate electrode of the TFT 243 of the green pixel unit 232 is electrically connected with the scan line 22 below the green pixel unit 232, and a source electrode of the TFT 243 of the green pixel unit 232 is electrically connected with the data line 21 on the left of the green pixel unit 232; a drain electrode of the TFT 244 of the blue pixel unit 233 is electrically connected with the pixel electrode 253 of the blue pixel unit 233, a gate electrode of the TFT 244 of the blue pixel unit 233 is electrically connected with the scan line 22 below the blue pixel unit 233, and a source electrode of the TFT 244 of the blue pixel unit 233 is electrically connected with the data line 21 on the left of the blue pixel unit 233.

In addition to the electrical connection way that both the first TFT 241 and the second TFT 241 are connected with the data line 21 and the scan line 22 as shown in FIG. 2A, other connection ways may also be used. For example, referring to FIG. 2B, FIG. 2B is different from FIG. 2A in that, the gate 241c of the first TFT 241 is electrically connected with the scan line 22 below the white pixel unit 234 including the first TFT 241, and the gate electrode 242c of the second TFT 242 is electrically connected with the scan line 22 above the white pixel unit 234 including the second TFT 242.

Figure 2B:
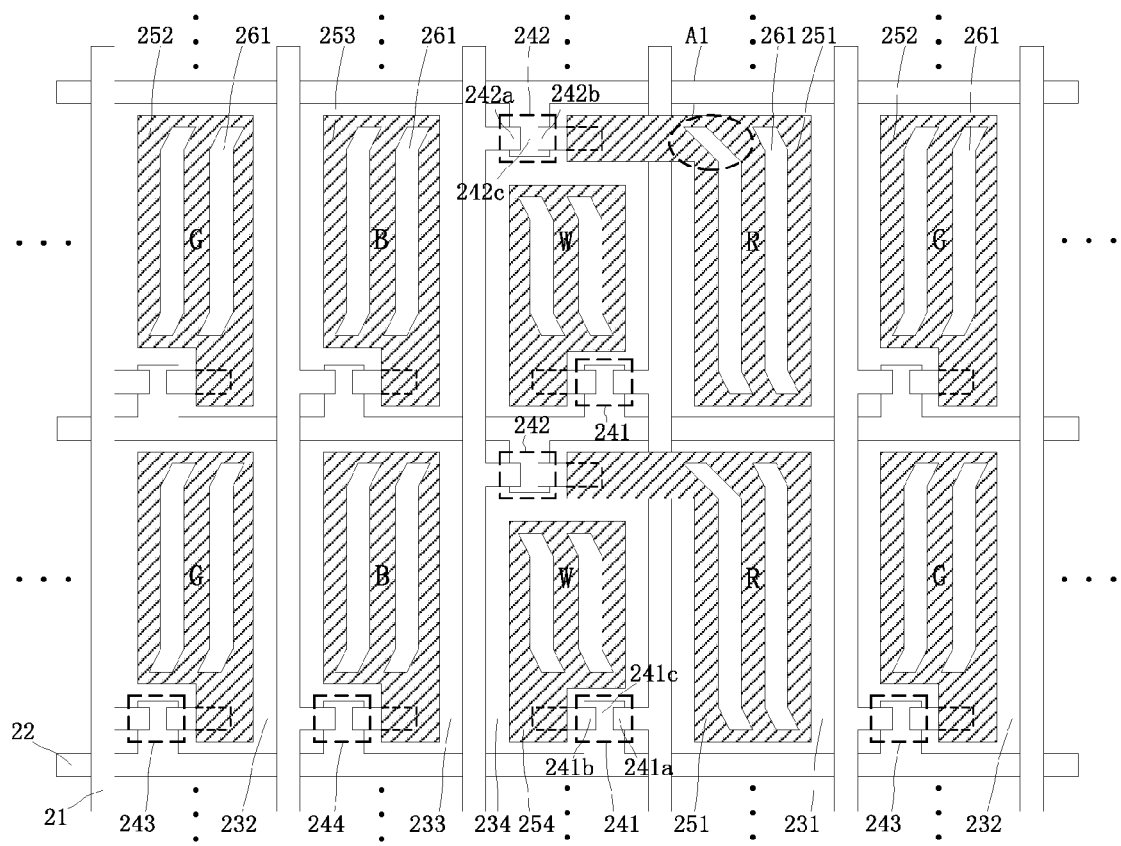
FIG. 2B is a schematic diagram of the structure of another pixel structure according to embodiments of the disclosure.
Figure 3A:
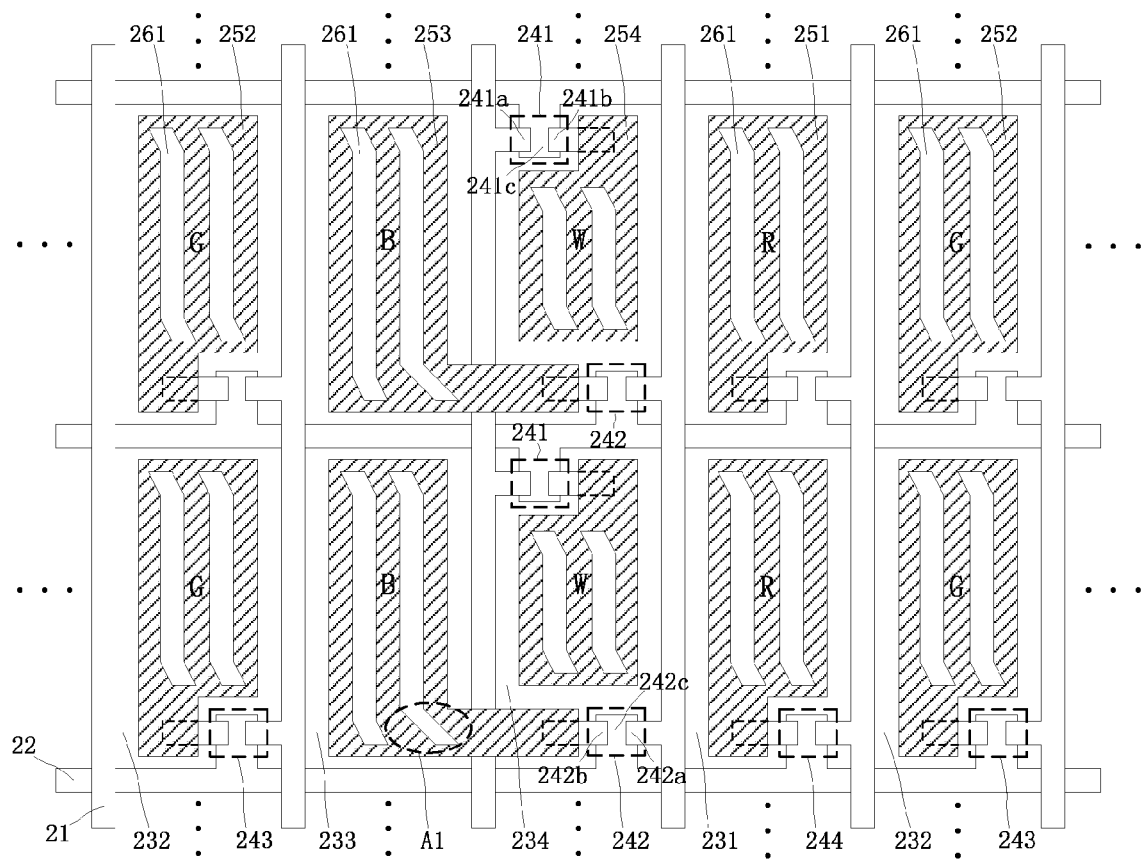
FIG. 3A is a schematic diagram of the structure of a further pixel structure according to embodiments of the disclosure.

In a row of pixel units, in addition to that the second TFT 242 is connected with the pixel electrode 251 of the red pixel unit 231 adjacent to the whit pixel unit 234 including the second TFT 242 as shown in FIGS. 2A and 2B, the second TFT 242 may also be connected with the pixel electrode 253 in the blue pixel unit 233 adjacent to the white pixel unit 234 including the second TFT 242 as shown in FIG. 3A. The above pixel structure can effectively improve the brightness of a blue image when the blue image is displayed.

In FIG. 3A, a source electrode 241a of the first TFT 241 is electrically connected to the data line 21 (i.e., the data line 21 on the left of the white pixel unit 234 in FIG. 3A) corresponding to the white pixel unit 234 including the first TFT 241, a gate electrode 241c of the first TFT 241 is electrically connected to the scan line 22 (i.e., the scan line 22 above the white pixel unit 234 in FIG. 3A) corresponding to the white pixel unit 234 including the first TFT 241, and a drain electrode 241b of the first TFT 241 is electrically connected to the pixel electrode 254 of the white pixel unit 234 including the first TFT 241; further, a source electrode 242a of the second TFT 242 is electrically connected to the data line 21 (i.e., the data line 21 on the right of the white pixel unit 234 in FIG. 3A) corresponding to the blue pixel unit 233 in the same row with and adjacent to the white pixel unit 234 including the second TFT 242; a gate electrode 242c of the second TFT 242 is electrically connected to the scan line 22 (i.e., the scan line 22 below the white pixel unit 234 in FIG. 3A) corresponding to the blue pixel unit 233 in the same row with and adjacent to the white pixel unit 234 including the second TFT 242; and a drain electrode 242b of the second TFT 242 is electrically connected to the pixel electrode 253 of the blue pixel unit 233 in the same row with and adjacent to the white pixel unit 234 including the second TFT 242. Additionally, a drain electrode of the TFT 243 of the green pixel unit 232 is electrically connected with the pixel electrode 252 of the green pixel unit 232, a gate electrode of the TFT 243 of the green pixel unit 232 is electrically connected with the scan line 22 below the green pixel unit 232, and a source electrode of the TFT 243 of the green pixel unit 232 is electrically connected with the data line 21 on the right of the green pixel unit 232; a drain electrode of the TFT 244 of the red pixel unit 231 is electrically connected with the pixel electrode 251 of the red pixel unit 231, a gate electrode of the TFT 244 of the red pixel unit 231 is electrically connected with the scan line 22 below the red pixel unit 231, and a source electrode of the TFT 244 of the red pixel unit 231 is electrically connected with the data line 21 on the right of the red pixel unit 231.

Figure 3B:
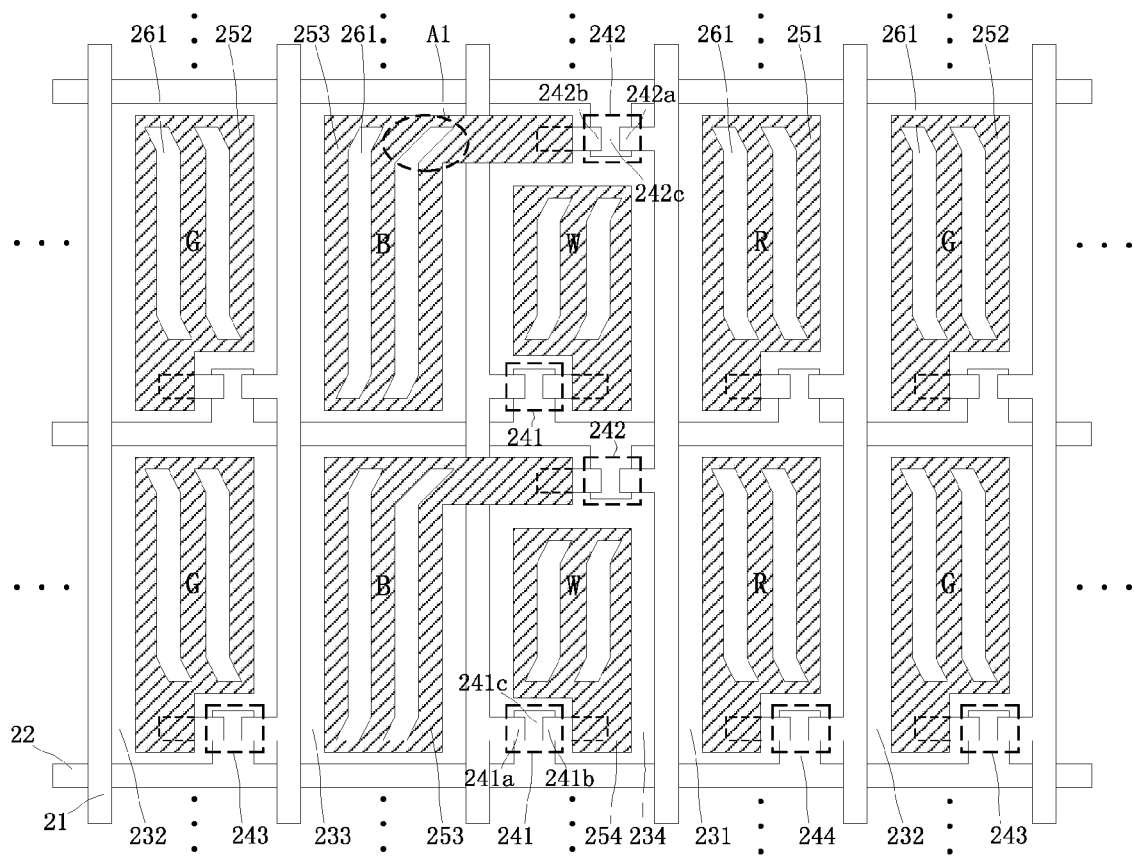
FIG. 3B is a schematic diagram of the structure of yet another pixel structure according to embodiments of the disclosure.

In addition to the electrical connection ways that both the first TFT 241 and the second TFT 241 are connected with the data line 21 and the scan line 22 as shown in FIG. 3A, other connection ways may also be used. For example, referring to FIG. 3B, FIG. 3B is different from the FIG. 3A in that, the gate electrode 241c of the first TFT 241 is electrically connected with the scan line 22 below the white pixel unit 234 including the first TFT 241, and the gate electrode 242c of the second TFT 242 is electrically connected with the scan line 22 above the white pixel unit 234 including the second TFT 242.

As shown in FIGS. 2A and 2B, in a row of pixel units, the second TFT 242 controls the red pixel unit 231 adjacent to the white pixel unit 234 including the second TFT 242. As shown in FIGS. 3A and 3B, in a row of pixel units, the second TFT 242 controls the blue pixel unit 233 adjacent to the white pixel unit 234 including the second TFT 242. Additionally, referring to FIG. 4A, the second TFT may also control the pixel unit in such a manner that, in one of any two adjacent rows of pixel units, a second TFT 2421 of each white pixel unit 234 is electrically connected with a pixel electrode 251 of a red pixel unit 231 adjacent to the white pixel unit 234; and in the other one of the any two adjacent rows of pixel units, a second TFT 2422 of each white pixel unit 234 is electrically connected with a pixel electrode 253 of a blue pixel unit 233 adjacent to the white pixel unit 234. Comparing with the pixel structure of related art, the above pixel structure can effectively improve the brightness of a red image or a blue image when the red image or the blue image is displayed.

Figure 4A:
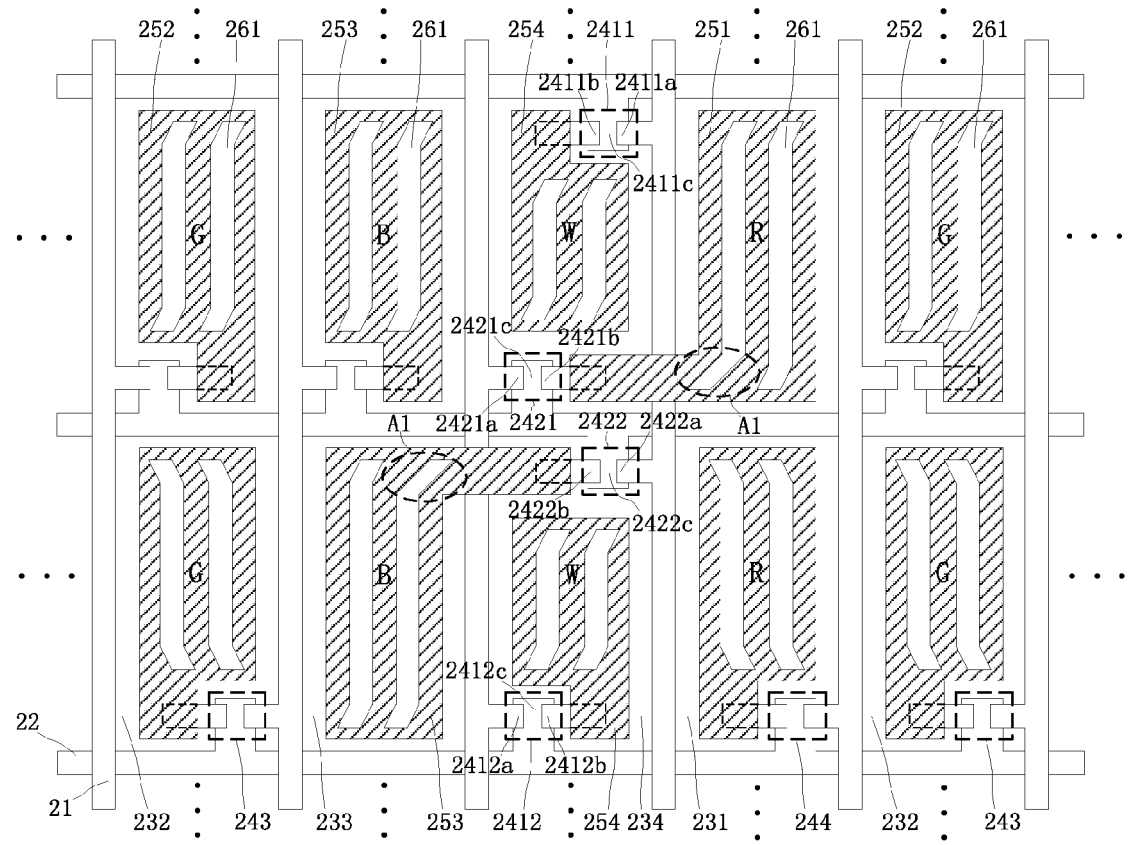
FIG. 4A is a schematic diagram of the structure of yet another pixel structure according to embodiments of the disclosure.

As shown in FIG. 4A, in the white pixel unit 234 including a second TFT 2421 configured for controlling the red pixel unit 231, a source electrode 2411a of a first TFT 2411 is electrically connected to the data line 21 on the right of the white pixel unit 234 including the first TFT 2411, a gate electrode 2411c of the first TFT 2411 is electrically connected to the scan line 22 above the white pixel unit 234 including the first TFT 2411, and a drain electrode 2411b of the first 2411 is electrically connected to the pixel electrode 254 of the white pixel unit 234 including the first TFT 2411; further, a source electrode 2421a of the second TFT 2421 is electrically connected to the data line 21 on the left of the white pixel unit 234 including the second TFT 2421, a gate electrode 2421c of the second TFT 2421 is electrically connected to the scan line 22 below the white pixel unit 234 including the second TFT 2421, and a drain electrode 2421b of the second TFT 2421 is electrically connected to the pixel electrode 251 of the red pixel unit 231 in the same row with and adjacent to the white pixel unit 234 including the second TFT 2412. Additionally, in a row of pixel units including the red pixel unit 233, a drain electrode of the TFT 243 of the green pixel unit 232 is electrically connected with the pixel electrode 252 of the green pixel unit 232, a gate electrode of the TFT 243 of the green pixel unit 232 is electrically connected with the scan line 22 below the green pixel unit 232, and a source electrode of the TFT 243 of the green pixel unit 232 is electrically connected with the data line 21 on the left of the green pixel unit 232; further, a drain electrode of the TFT 244 of the blue pixel unit 233 is electrically connected with the pixel electrode 253 of the blue pixel unit 233, a gate electrode of the TFT 244 of the blue pixel unit 233 is electrically connected with the scan line 22 below the blue pixel unit 233, and a source electrode of the TFT 244 of the blue pixel unit 233 is electrically connected with the data line 21 on the left of the blue pixel unit 233.

As shown in FIG. 4A, in the white pixel unit 234 including the second TFT 2422 configured for controlling the blue pixel unit 233, a source electrode 2412a of a first TFT 2412 is electrically connected to the data line 21 on the left of the white pixel unit 234 including the first TFT 2412, a gate electrode 2412c of the first TFT 2412 is electrically connected to the scan line 22 below the white pixel unit 234 including the first TFT 2412, and a drain electrode 2412b of the first 2412 is electrically connected to the pixel electrode 254 of the white pixel unit 234 including the first TFT 2412; further, a source electrode 2422a of the second TFT 2422 is electrically connected to the data line 21 on the right of the white pixel unit 234 including the second TFT 2422; a gate electrode 2422c of the second TFT 2422 is electrically connected to the scan line 22 above the white pixel unit 234 including the second TFT 2422; a drain electrode 2422b of the second TFT 2422 is electrically connected to the pixel electrode 253 of the blue pixel unit 233 in the same row with and adjacent to the white pixel unit 234 including the second TFT 2422. Additionally, in a row of pixel units including the blue pixel unit 233, a drain electrode of the TFT 243 of the green pixel unit 232 is electrically connected with the pixel electrode 252 of the green pixel unit 232, a gate electrode of the TFT 243 of the green pixel unit 232 is electrically connected with the scan line 22 below the green pixel unit 232, and a source electrode of the TFT 243 of the green pixel unit 232 is electrically connected with the data line 21 on the right of the green pixel unit 232; further, a drain electrode of the TFT 244 of the red pixel unit 231 is electrically connected with the pixel electrode 251 of the red pixel unit 231, a gate electrode of the TFT 244 of the red pixel unit 231 is electrically connected with the scan line 22 below the red pixel unit 231, and a source electrode of the TFT 244 of the red pixel unit 231 is electrically connected with the data line 21 on the left of the red pixel unit 231.

Figure 4B:
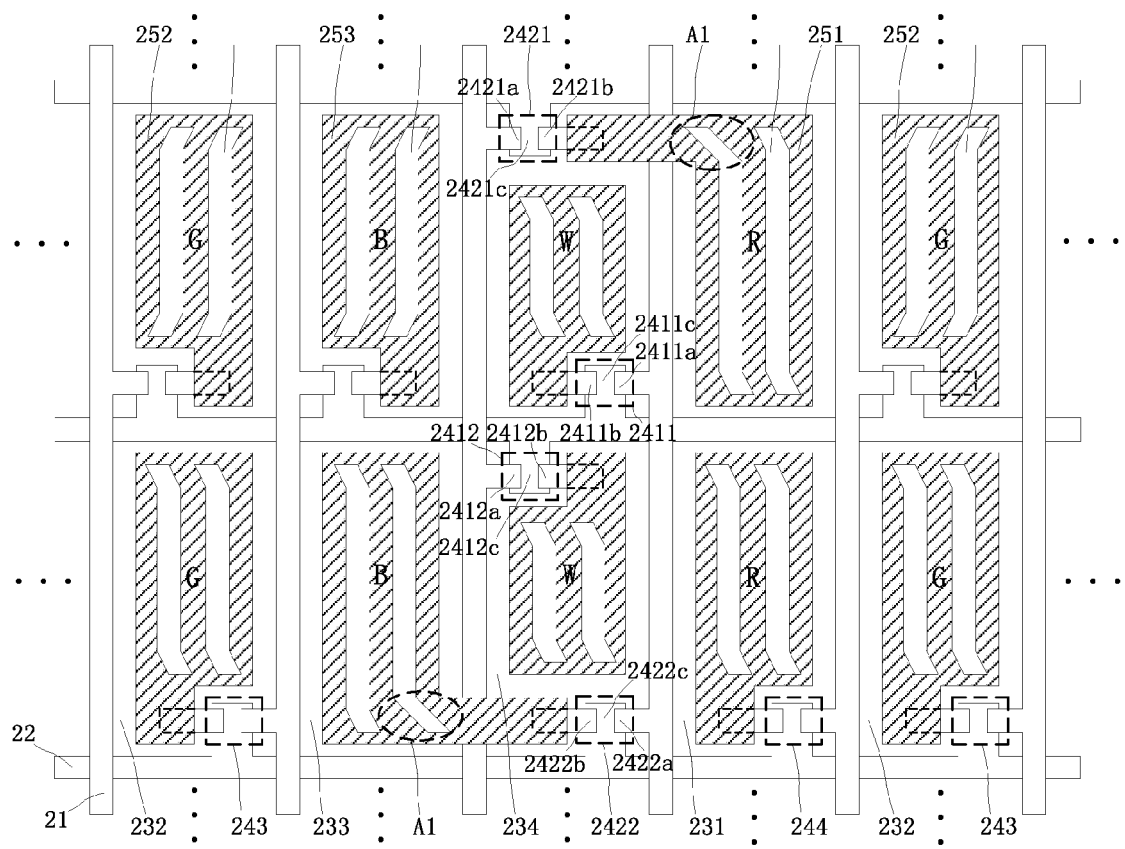
FIG. 4B is a schematic diagram of the structure of yet another pixel structure according to embodiments of the disclosure.

In addition to the electrical connection ways that both the first TFT 241 and the second TFT 241 are connected with the data line 21 and the scan line 22 as shown in FIG. 4A, other connection ways may also be used. For example, referring to FIG. 4B, FIG. 4B is different from FIG. 4A in that in the white pixel unit 234 including the second TFT 2421 configured for controlling the red pixel unit 231, the gate 2411c of the first TFT 2411 is electrically connected with the scan line 22 below the white pixel unit 234 including the first TFT 2411, and the gate electrode 2421c of the second TFT 2421 is electrically connected with the scan line 22 above the white pixel unit 234 including the second TFT 2421; and in the white pixel unit 234 including the second TFT 2422 configured for controlling the blue pixel unit 233, the gate electrode 2412c of the first TFT 2412 is electrically connected with the scan line 22 above the white pixel unit 234 including the first TFT 2412, and the gate electrode 2422c of the second TFT 2422 is electrically connected with the scan line 22 below the white pixel unit 234 including the second TFT 2422.

In the above pixel structure, the pixel units are arranged as a matrix. Alternatively, the pixel units may also be arranged in a staggered way. The pixel structure formed by arranging the pixel units in the staggered way can refer to the above pixel structure formed by arranging the pixel units as a matrix, and will not be repeated again herein.

It should be noted that, the above pixel structures are given as examples of embodiments of the disclosure, but other examples are also possible. For example, in one of two adjacent columns of pixel units, a second TFT of a white pixel unit is electrically connected with a pixel electrode of a blue pixel unit in the same row with and adjacent to the white pixel unit, in the other one of the two adjacent columns of pixel units, a second TFT of a white pixel unit is electrically connected with a pixel electrode of a red pixel unit in the same row with and adjacent to the white pixel unit; or alternatively, the white pixel units including the second TFTs configured for controlling the red pixel units and the white pixel units including the second TFTs configured for controlling the blue pixel units are not distributed uniformly in the pixel structure. All above structures can be employed as long as the brightness of a certain color image can be improved when displaying the certain color image, which is not limited thereto.

Figure 5:
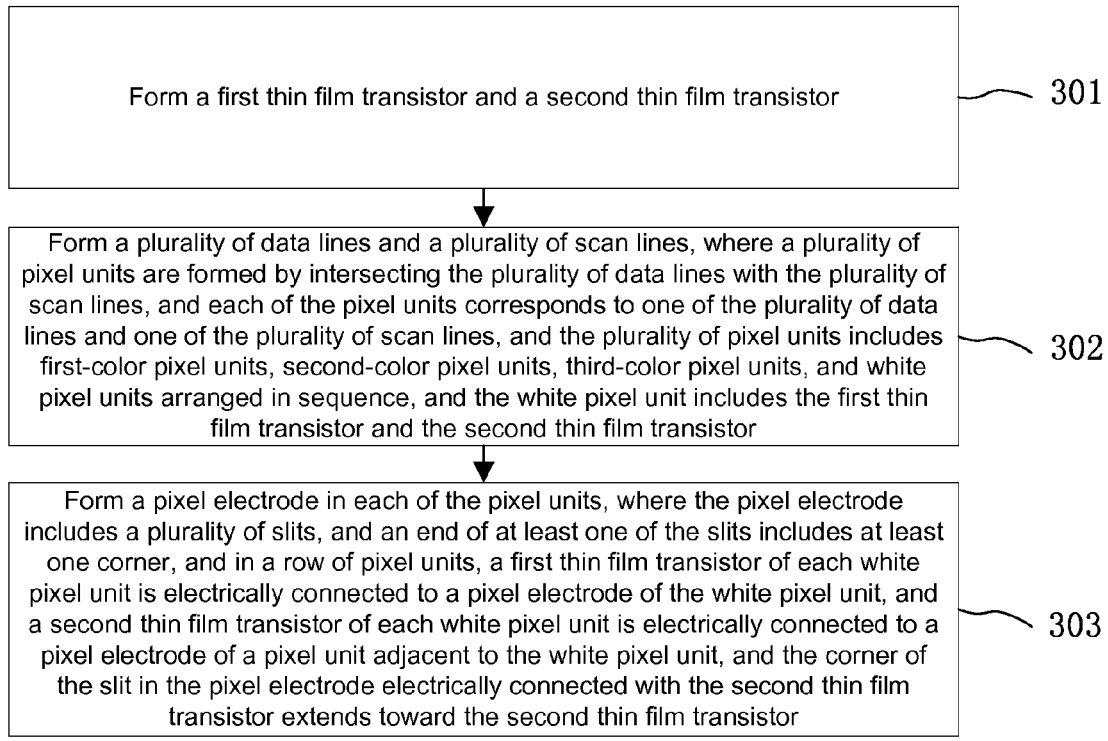
FIG. 5 is a schematic flowchart of a manufacture method of a pixel structure according to embodiments of the disclosure.

Embodiments of the disclosure provide a manufacturing method of a pixel structure. FIG. 5 is a schematic flowchart of a manufacture method of a pixel structure according to embodiments of the disclosure. As shown in FIG. 5, the manufacturing method of the pixel structure includes Steps S301-S303 as below.

In Step S301 a first TFT and a second TFT are formed.

The formed first TFT and second TFT each include a gate electrode, a source electrode, a drain electrode, and an active area between the source electrode and drain electrode, where the gate electrodes of both the two TFTs may be located above the source electrode and the drain electrode (the TFT with a top-gate structure), or located below the source electrode and the drain electrode (the TFT with a bottom-gate structure), which is not limited thereto.

In Step S302, a plurality of data lines and a plurality of scan lines are formed, where a plurality of pixel units are formed by intersecting the plurality of data lines with the plurality of scan lines, each of the pixel units corresponds to one of the plurality of data lines and one of the plurality of scan lines. The plurality of pixel units includes first-color pixel units, second-color pixel units, third-color pixel units, and white pixel units arranged in sequence, and the white pixel unit includes the first thin film transistor and the second thin film transistor.

In Step S303, a pixel electrode is formed in each of the pixel units. The pixel electrode includes a plurality of slits, and an end of at least one of the slits includes at least one corner. In a row of pixel units, a first thin film transistor of each white pixel unit is electrically connected to a pixel electrode of the white pixel unit, and a second thin film transistor of each white pixel unit is electrically connected to a pixel electrode of a pixel unit adjacent to the white pixel unit. The corner of the slit in the pixel electrode electrically connected with the second thin film transistor extends toward the second thin film transistor.

Figure 6:
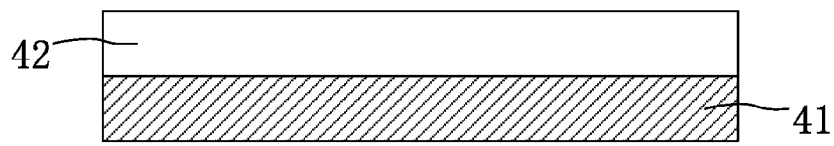
FIG. 6 is a schematic diagram of the structure of an array substrate according to embodiments of the disclosure.

Embodiments of the disclosure provide an array substrate. FIG. 6 is a schematic diagram of the structure of the array substrate according to embodiments of the disclosure. Referring to FIG. 6, the array substrate includes a glass substrate 41 and a pixel structure 42 which may be the pixel structure according to the above embodiments.

Figure 7:
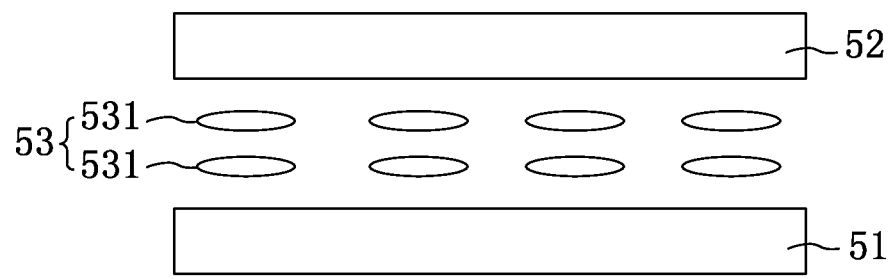
FIG. 7 is a schematic diagram of the structure of a display panel according to embodiments of the disclosure.

Embodiments of the disclosure provide a display panel. FIG. 7 is a schematic diagram of the structure of a display panel according to embodiments of the disclosure. Referring to FIG. 7, the display panel includes an array substrate 51, a color filter substrate 52 disposed opposite to the array substrate 51, and a liquid crystal layer 53 located between the array substrate 51 and the color filter substrate 52. The liquid crystal layer 53 is formed of liquid crystal molecules 531. The array substrate 51 may be the array substrate according to the above embodiments.

It is noted that the above display panel may have or not have a touch sensing function, depending on specific requirements. The touch sensing function may be an electromagnetic touch sensing function, a capacitive touch sensing function or an electromagnetism and capacitance integrated touch sensing function.

Figure 8:
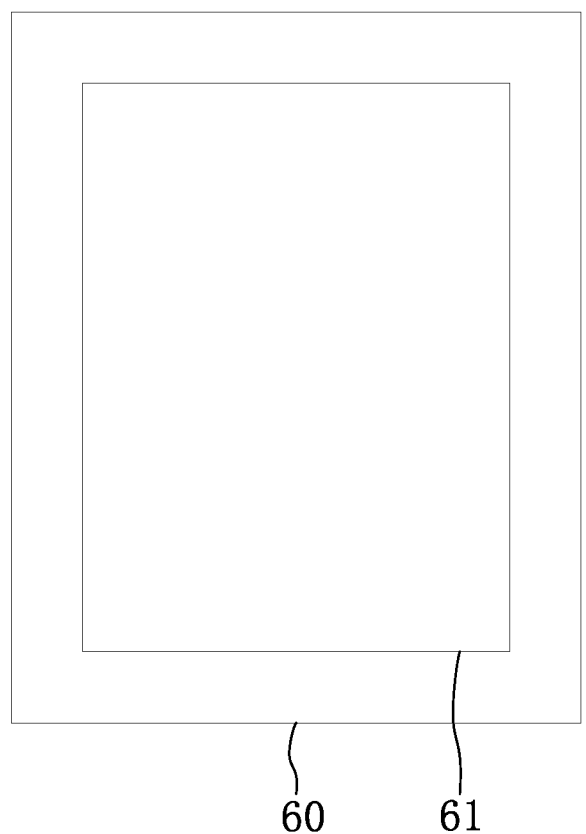
FIG. 8 is a schematic diagram of the structure of a display device according to embodiments of the disclosure.

Embodiments of the disclosure provide a display device 60. FIG. 8 is a schematic diagram of the structure of a display device 60. Referring to FIG. 8, the display device 60 includes a display panel 61, and further includes a drive circuit and other devices for supporting a normal operation of the display device 60. The display panel 61 is the display panel according to the above embodiments. The display device 60 may be one of a cellphone, a desktop computer, a laptop computer, a tablet computer and an electronic paper.

With the pixel structure, the manufacturing method of the pixel structure, the array substrate, display panel, and the display device, according to embodiments of the disclosure, since in a row of pixel units, the second TFT of the pixel unit adjacent to the white pixel unit is disposed within the white pixel unit, the pixel unit controlled by the second TFT has more space to dispose the pixel electrode so as to allow a bigger-sized pixel electrode, so that the opening of the pixel unit including the pixel electrode is bigger, and thus the brightness of the color image corresponding to the pixel unit is effectively improved when displaying the color image.

It is noted that the embodiments and the applied technology principles of the disclosure are merely described as above. It should be understood for those skilled in the art that the disclosure is not limited to particular embodiments described herein. Various apparent changes, readjustment and alternative can be made by those skilled in the art without departing the scope of protection of the disclosure. Therefore, although the disclosure is illustrated in detail through the above embodiments, the disclosure is not merely limited to the above embodiments, and can further include more of other equivalent embodiments without departing the conception of the disclosure. The scope of the disclosure is subject to the appended claims.

Various modifications and additions can be made to the exemplary embodiments discussed without departing from the scope of the disclosure. For example, while the embodiments described above refer to particular features, the scope of this disclosure also includes embodiments having different combinations of features and embodiments that do not include all of the described features. Accordingly, the scope of the disclosure is intended to embrace all such alternatives, modifications, and variations as fall within the scope of the claims, together with all equivalents thereof.

We claim:

1. A pixel structure, comprising:
   a plurality of data lines and a plurality of scan lines; and
   a plurality of pixel units formed by intersecting the plurality of data lines with the plurality of scan lines, wherein each of the pixel units corresponds to one of the plurality of data lines and one of the plurality of scan lines, and the plurality of pixel units comprise a first-color pixel unit, a second-color pixel unit, a third-color pixel unit and a white pixel unit arranged in sequence;
   at least one of the pixel units comprises a pixel electrode comprising a plurality of slits, with an end portion of at least one of the slits comprising at least one corner;
   the white pixel unit comprises a first thin film transistor and a second thin film transistor, wherein the first thin film transistor is electrically connected to a pixel electrode of the white pixel unit, and the second thin film transistor is electrically connected to a pixel electrode of an adjacent pixel unit in a same row with the white pixel unit;
   wherein, the pixel electrode of the adjacent pixel unit is a first pixel electrode including first slits with a first end portion of at least one of the first slits including a first corner;
   an extended portion of the first pixel electrode extends from the first corner to the second thin film transistor; and
   the first end portion of the at least one of the first slits of the first pixel electrode extends from the first corner toward the second thin film transistor.

2. The pixel structure of claim 1, wherein the adjacent pixel unit in the same row with the white pixel unit is the third-color pixel unit.

3. The pixel structure of claim 1, wherein the adjacent pixel unit in the same row with the white pixel unit is the first-color pixel unit.

4. The pixel structure of claim 1, wherein in one of any two adjacent rows of the pixel units, the second thin film transistor of the white pixel unit is electrically connected with a pixel electrode of an adjacent third-color pixel unit in the same row with the white pixel unit; and in the other one of the any two adjacent rows of the pixel units, the second thin film transistor of the white pixel unit is electrically connected with a pixel electrode of an adjacent first-color pixel unit in the same row with the white pixel unit.

5. The pixel structure of claim 1, wherein:
the first-color pixel unit is a red pixel unit, the second-color pixel unit is a green pixel unit, and the third-color pixel unit is a blue pixel unit; or
the first-color pixel unit is a green pixel unit, the second-color pixel unit is a red pixel unit, and the third-color pixel unit is a blue pixel unit.

6. The pixel structure of claim 1, wherein:
a source electrode of the first thin film transistor is electrically connected to the data line corresponding to the white pixel unit comprising the first thin film transistor;
a gate electrode of the first thin film transistor is electrically connected to the scan line corresponding to the white pixel unit, the white pixel unit comprises the first thin film transistor;
a source electrode of the second thin film transistor is electrically connected to the data line corresponding to the adjacent pixel unit comprising the pixel electrode electrically connected to the second thin film transistor; and
a gate electrode of the second thin film transistor is electrically connected to the scan line corresponding to the adjacent pixel unit comprising the pixel electrode electrically connected to the second thin film transistor.

7. The pixel structure of claim 1, wherein the plurality of pixel units are arranged in a staggered way or as a matrix.

8. An array substrate, comprising a pixel structure, the pixel structure comprising:
a plurality of data lines and a plurality of scan lines; and
a plurality of pixel units formed by intersecting the plurality of data lines with the plurality of scan lines, wherein each of the pixel units corresponds to one of the plurality of data lines and one of the plurality of scan lines, and the plurality of pixel units comprise a first-color pixel unit, a second-color pixel unit, a third-color pixel unit and a white pixel unit arranged in sequence;
at least one of the pixel units comprises a pixel electrode comprising a plurality of slits, with an end portion of at least one of the slits comprising at least one corner;
the white pixel unit comprises a first thin film transistor and a second thin film transistor, wherein the first thin film transistor is electrically connected to a pixel electrode of the white pixel unit, and the second thin film transistor is electrically connected to a pixel electrode of an adjacent pixel unit in a same row with the white pixel unit;
wherein the pixel electrode of the adjacent pixel unit is a first pixel electrode including first slits with a first end portion of at least one of the first slits including a first corner;
an extended portion of the first pixel electrode extends from the first corner to the second thin film transistor; and
the first end portion of the at least one of the first slits of the first pixel electrode extends from the first corner toward the second thin film transistor.

9. A display panel, comprising an array substrate, the array substrate comprising a pixel structure, the pixel structure comprising:
a plurality of data lines and a plurality of scan lines; and
a plurality of pixel units formed by intersecting the plurality of data lines with the plurality of scan lines, wherein each of the pixel units corresponds to one of the plurality of data lines and one of the plurality of scan lines, and the plurality of pixel units comprise a first-color pixel unit, a second-color pixel unit, a third-color pixel unit and a white pixel unit arranged in sequence;
at least one of the pixel units comprises a pixel electrode comprising a plurality of slits, with an end portion of at least one of the slits comprising at least one corner;
the white pixel unit comprises a first thin film transistor and a second thin film transistor, wherein the first thin film transistor is electrically connected to a pixel electrode of the white pixel unit, and the second thin film transistor is electrically connected to a pixel electrode of an adjacent pixel unit in a same row with the white pixel unit;
wherein the pixel electrode of the adjacent pixel unit is a first pixel electrode including first slits with a first end portion of at least one of the first slits including a first corner;
an extended portion of the first pixel electrode extends from the first corner to the second thin film transistor; and
the first end portion of the at least one of the first slits of the first pixel electrode extends from the first corner toward the second thin film transistor.

10. A display device, comprising a display panel, the display panel comprising an array substrate, the array substrate comprising a pixel structure, the pixel structure comprising:
a plurality of data lines and a plurality of scan lines; and
a plurality of pixel units formed by intersecting the plurality of data lines with the plurality of scan lines, wherein each of the pixel units corresponds to one of the plurality of data lines and one of the plurality of scan lines, and the plurality of pixel units comprise a first-color pixel unit, a second-color pixel unit, a third-color pixel unit and a white pixel unit arranged in sequence;
at least one of the pixel units comprises a pixel electrode comprising a plurality of slits, with an end portion of at least one of the slits comprising at least one corner;
the white pixel unit comprises a first thin film transistor and a second thin film transistor, wherein the first thin film transistor is electrically connected to a pixel electrode of the white pixel unit, and the second thin film transistor is electrically connected to a pixel electrode of an adjacent pixel unit in a same row with the white pixel unit;
wherein the pixel electrode of the adjacent pixel unit is a first pixel electrode including first slits with a first end portion of at least one of the first slits including a first corner;
an extended portion of the first pixel electrode extends from the first corner to the second thin film transistor; and
the first end portion of the at least one of the first slits of the first pixel electrode extends from the first corner toward the second thin film transistor.

* * * * *